(12) United States Patent　　(10) Patent No.:　　US 6,459,968 B1
Kochie　　(45) Date of Patent:　　Oct. 1, 2002

(54) DIGITAL AUTOMOBILE TESTER

(75) Inventor: Robert Kochie, Mantorville, MN (US)

(73) Assignee: SPX Corporation, Charlotte, NC (US)

( * ) Notice: Subject to any disclaimer, the term of this patent is extended or adjusted under 35 U.S.C. 154(b) by 0 days.

(21) Appl. No.: 09/629,871

(22) Filed: Aug. 1, 2000

Related U.S. Application Data

(63) Continuation of application No. 29/123,355, filed on May 17, 2000.

(51) Int. Cl.$^7$ .................................................. G01R 13/28
(52) U.S. Cl. ........................ 701/29; 324/115; 73/118.01
(58) Field of Search .............................. 701/29, 34, 47; 324/115, 433, 427, 429, 379; 73/118.01

(56) References Cited

U.S. PATENT DOCUMENTS

| | | | |
|---|---|---|---|
| 4,086,531 A | 4/1978 | Bernier | 324/158 |
| 4,298,837 A | 11/1981 | Koslar | 324/72.5 |
| 5,367,250 A | 11/1994 | Whisenand | 324/133 |
| 5,469,049 A | 11/1995 | Briese et al. | 324/76.77 |
| 5,511,108 A | 4/1996 | Severt et al. | 379/21 |
| 5,541,840 A | 7/1996 | Gurne et al. | 364/424.03 |
| 5,825,353 A | 10/1998 | Will | 345/184 |
| 5,834,935 A | 11/1998 | Lyford | 324/156 |
| 5,923,161 A * | 7/1999 | Frankovitch, Jr. et al. | 324/115 |
| 5,981,907 A | 11/1999 | Maue | 219/203 |

* cited by examiner

*Primary Examiner*—William A. Cuchlinski, Jr.
*Assistant Examiner*—Arthur D. Donnelly
(74) *Attorney, Agent, or Firm*—Baker & Hostetler LLP

(57) ABSTRACT

Handheld electronic instrument for diagnosing the operating condition of a vehicle. The instrument is capable of performing the basic functions of a multimeter as well as able to test at least one system of a vehicle. This reduces the need for additional equipment that a technician must use and increases the efficiency and profitability of the technician. The instrument has a microprocessor, a memory storage for a computer program controlling the microprocessor and for other information, a display screen, a plurality of buttons, a rotary switch capable of being rotated by one finger of the operator of the instrument. The instrument has at least two display screens selections for monitoring and diagnosing a system of the vehicle, and each display screen has at least one operating mode for monitoring and diagnosing a function of the system, and the display screen selections are capable of being selected by the rotary switch.

22 Claims, 9 Drawing Sheets

DIGITAL AUTOMOBILE TESTER

This application is a continuation of application Ser. No. 29/123,355, filed on May 17, 2000, of which is hereby incorporated by reference in its entirety, including the drawings and the specification.

BACKGROUND OF THE INVENTION

1. Field of the Invention

This invention relates to handheld electronic instruments and more particularly to instruments for monitoring and diagnosing the operation of a vehicle.

2. Description of the Related Art

The demands placed on an automobile service technician have increased with the increasing complexity of modern vehicles. The systems of vehicles have grown in complexity to reduce pollution and increase safety and comfort. Technicians are required to perform their diagnosis of a vehicle's system quickly and efficiently, to increase profits of the service station and minimize the amount of time that people's cars spend in the repair shop. Moreover, while performing these tasks technicians are often require to simultaneously attend to other matters. To meet the needs of the technician serving today's cars, an increasing array of test equipment has been made available for testing the various systems of cars. The following United States Patents relate to such test equipment.

U.S. Pat. No. 4,298,837 discloses a handheld testing device that functions as a multimeter and has a switch for independently selecting functions and ranges for measuring different electrical quantities.

U.S. Pat. No. 5,367,250 discloses a handheld instrument for performing voltage and continuity tests on electrical systems of vehicles. Red and green LEDs mounted in the housing are operatively interconnected with the probe and power cable through circuitry that causes the red LED to glow when the probe contacts a positive voltage and the green LED to glow when the LED contacts a negative voltage.

U.S. Pat. No. 5,541,840 discloses a system that includes a handheld scan tool that is adapted to interface to the automobile and communicate with various on-board controllers to monitor the operation of the vehicle in real time. While the handheld tool can function as a digital multimeter, it is required to receive information from an on-board controller having a communication bus for communicating with external devices.

U.S. Pat. No. 5,834,935 discloses a digital multimeter with a housing having a battery compartment. A removable battery cover encloses the battery compartment, and has a probe aperture registered with the probe connector, so that a probe may be connected when the battery cover is installed.

None of these patents disclose an handheld electrical instrument that can function as a multimeter and also test various other systems of the vehicle as well. Furthermore, there is no disclosure of an instrument that can change the mode of display screen being used by a simple turn of a rotary switch. Also, the prior art is silent on the combined use of LEDs and a visual display screen to easily, simply and clearly convey information to the technician.

There is thus a particular need for a handheld instrument that is convenient and easy to use for the diagnosing and monitoring the performance of vehicles and that can also function as a multimeter.

SUMMARY OF THE INVENTION

The present invention provides an easily controlled handheld electronic instrument for diagnosing operating conditions of a vehicle. One advantage of the present invention is that it is suited for performing the basic functions of a multimeter as well as being able to diagnosis different conditions of a vehicle that a digital multimeter cannot test. This reduces the need for additional equipment that the technician must use and increases the efficiency and profitability of the technician. The instrument has a microprocessor, a memory storage for a computer program controlling the microprocessor and optionally for other information, a display screen, a plurality of buttons, as well as a rotary switch capable of being rotated by one finger of the operator of the instrument. The instrument has at least two display screens selections for monitoring and diagnosing a system of the vehicle, and each display screen has at least one operating mode for monitoring and diagnosing a function of the system, and the display screen selections are capable of being selected by the rotary switch.

Diagnostic and other information related to the operating condition of the test vehicle is conveyed to the operator by the display screen or a combination of the display screen and LEDs. The display screen will change the designation displayed thereon and immediate above the LEDs according to what test is being performed. The LEDs can convey qualitative information such as whether a standard has been met. For example, LEDs may indicate that the battery is low or the alternator should be checked. For each individual display space above the LEDs may indicate a condition of charge or no charge. Other examples are high, medium, medium low, or low; full rich, rich, lean or full lean; or open, good, suspect or bad. Often the qualitative value indicated by a LED is supplemented by a quantitative numerical output on the display screen for the same value.

These together with other various features of novelty which characterize the invention, are pointed out with particularity in the claims annexed to and forming a part of this disclosure. For a better understanding of the invention, and the advantages attained by its uses, reference should be had to the accompanying drawings and descriptive matter in which there is illustrated preferred embodiments of the invention.

BRIEF DESCRIPTION OF THE DRAWINGS

Other features and advantages of the present invention can be appreciated by referencing the following description of a presently preferred embodiment in conjunction with the drawings where.

DETAILED DESCRIPTION OF THE PREFERRED EMBODIMENT

As shown in FIGS. 1–10, the handheld digital automobile tester (DAT) 30 has a housing 32 with a display screen 34 on the front surface 36 of the housing near the upper end 40. Below the display screen 34 are four LEDs 38. The LEDs 38 are aligned next to the display screen 34.

Figure 1:
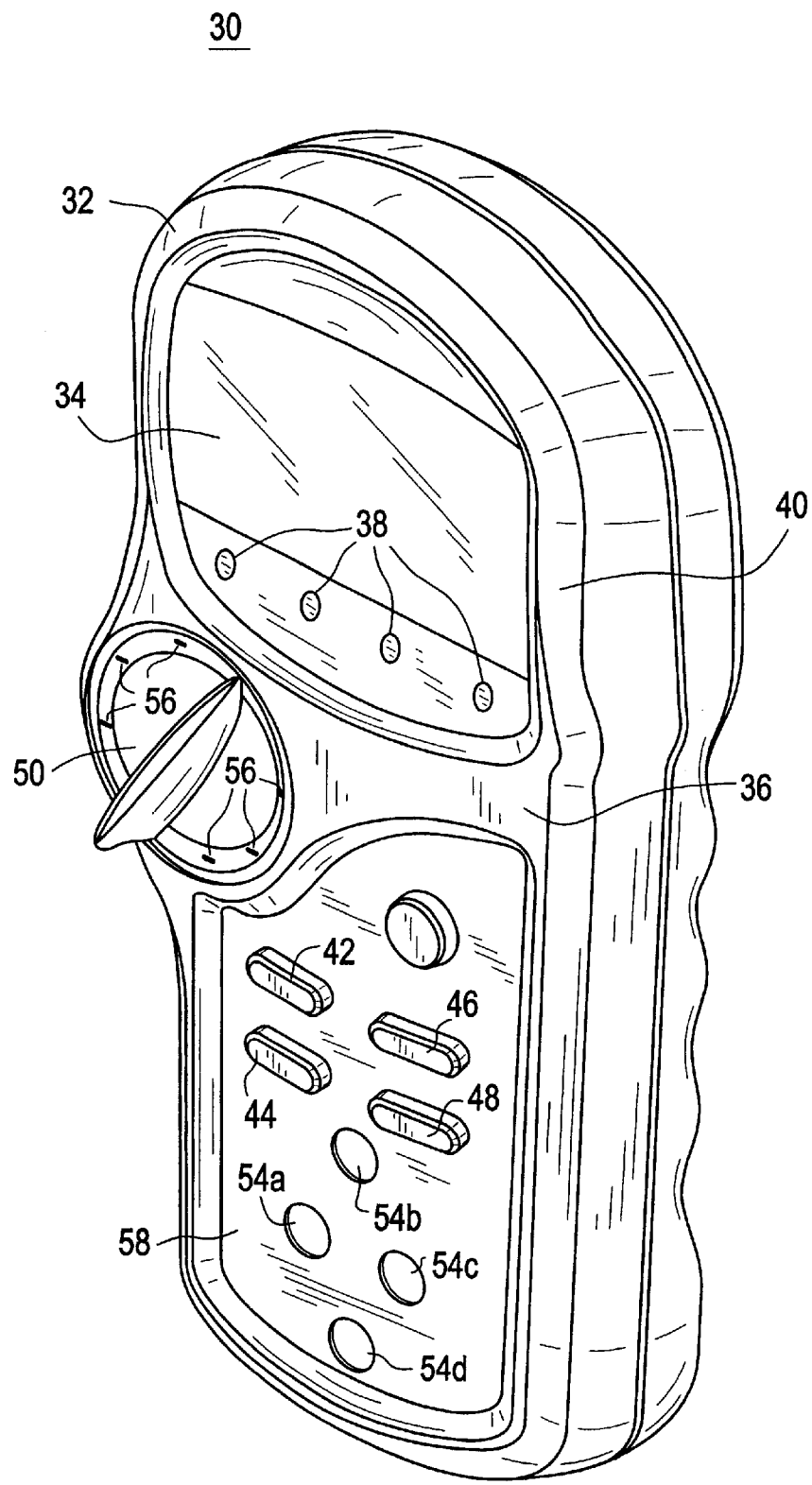
FIG. 1 is a perspective view of the present invention.
Figure 2:
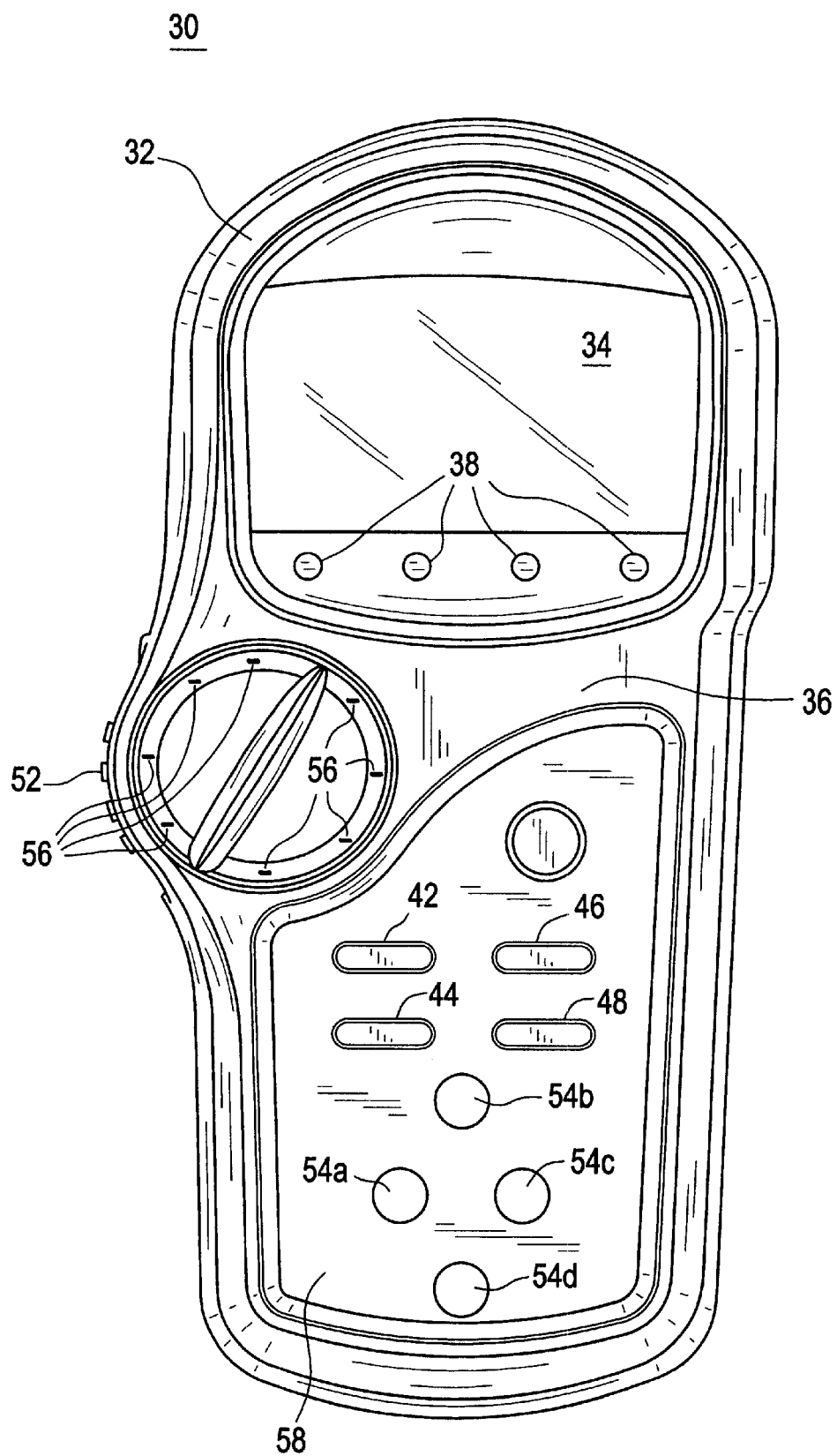
FIG. 2 is a front elevational view thereof.
Figure 3:
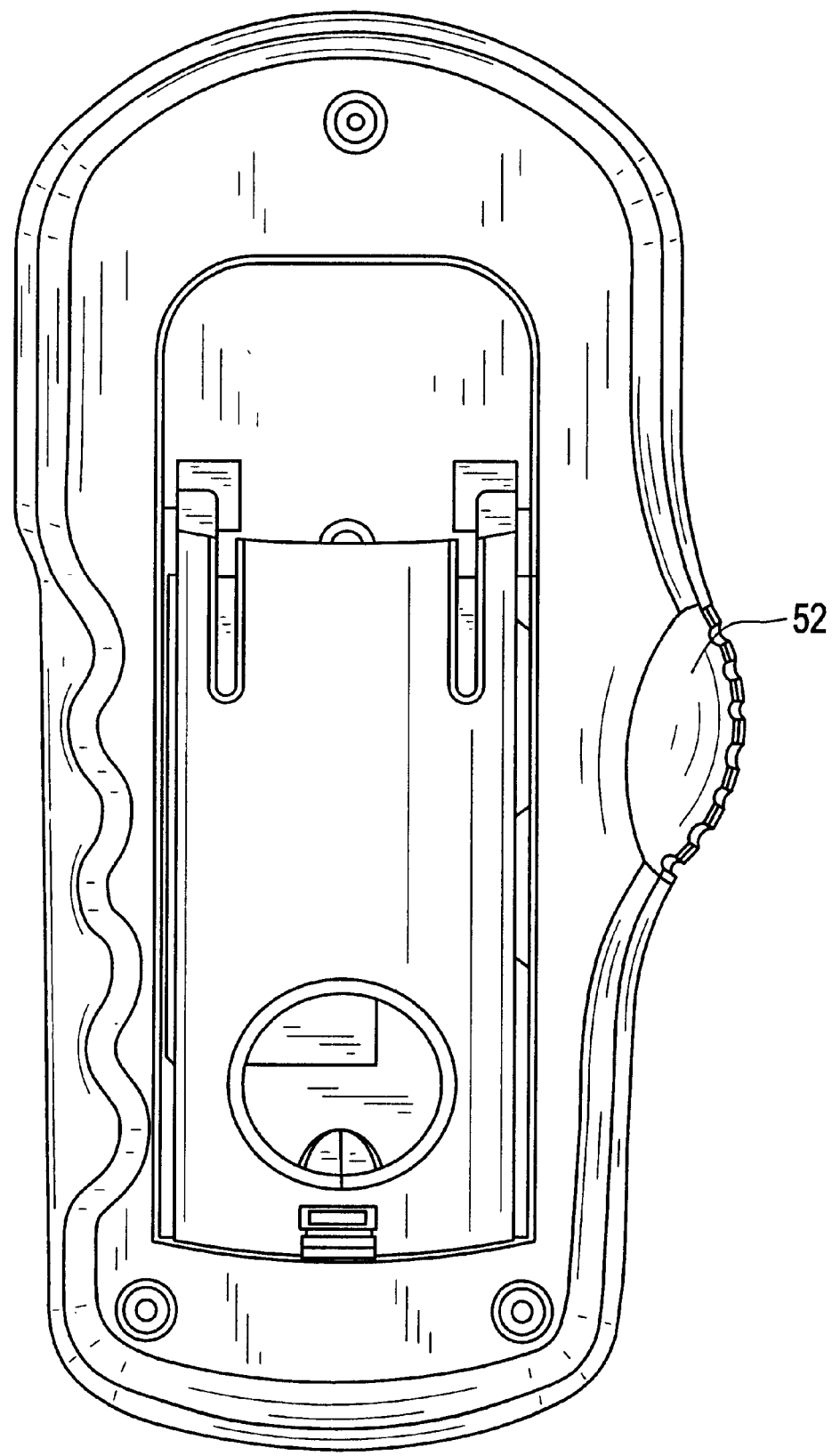
FIG. 3 is a rear elevational view thereof.
Figure 4:
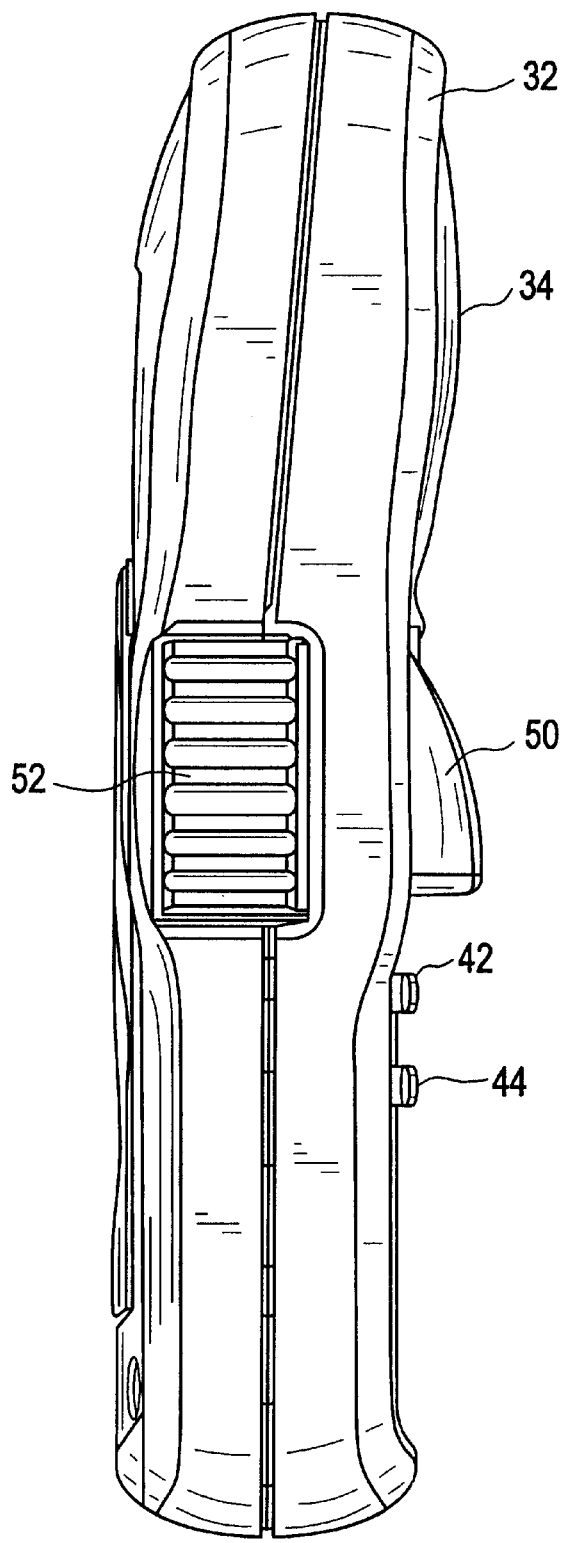
FIG. 4 is a left side elevational view thereof.
Figure 5:
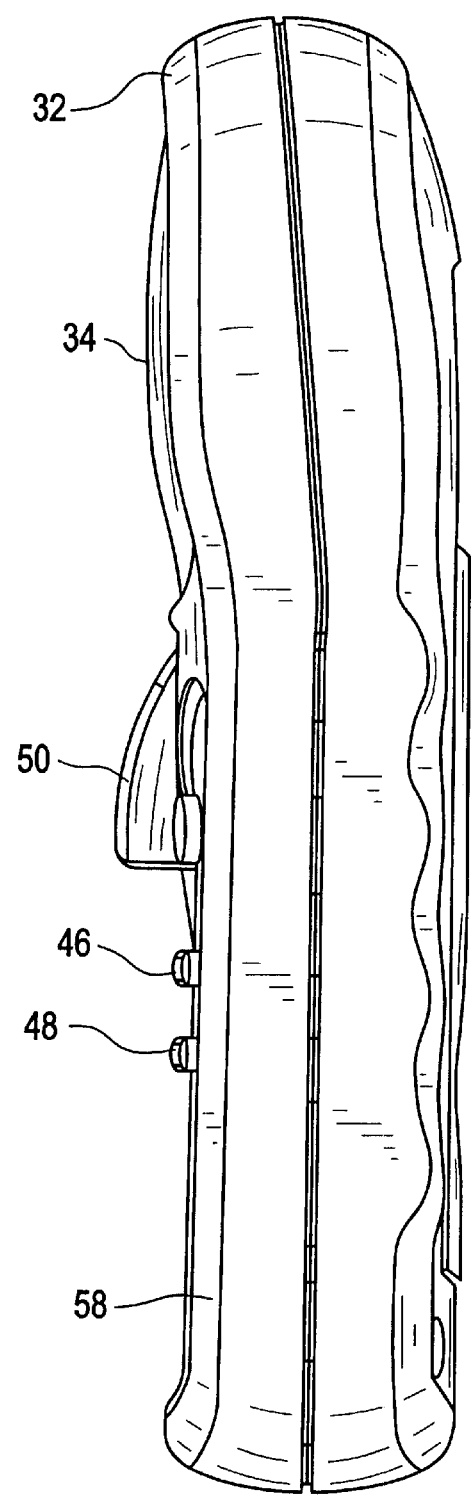
FIG. 5 is a right side elevational view thereof.
Figure 6:
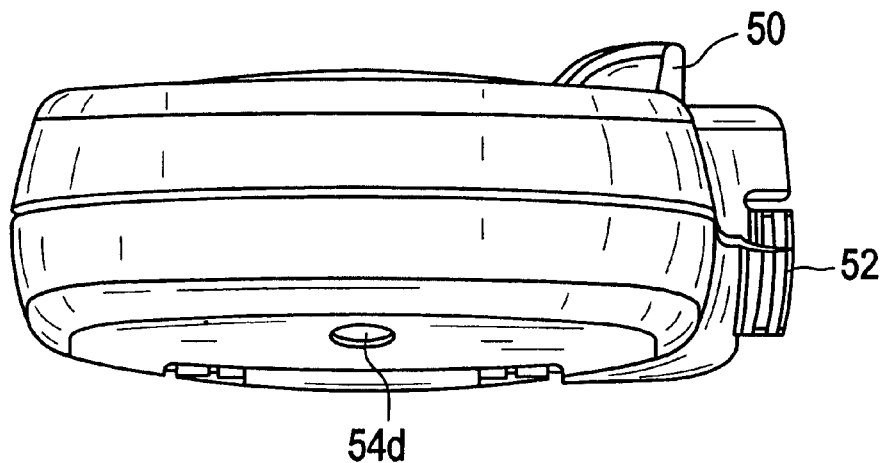
FIG. 6 is a bottom plan view thereof.
Figure 7:
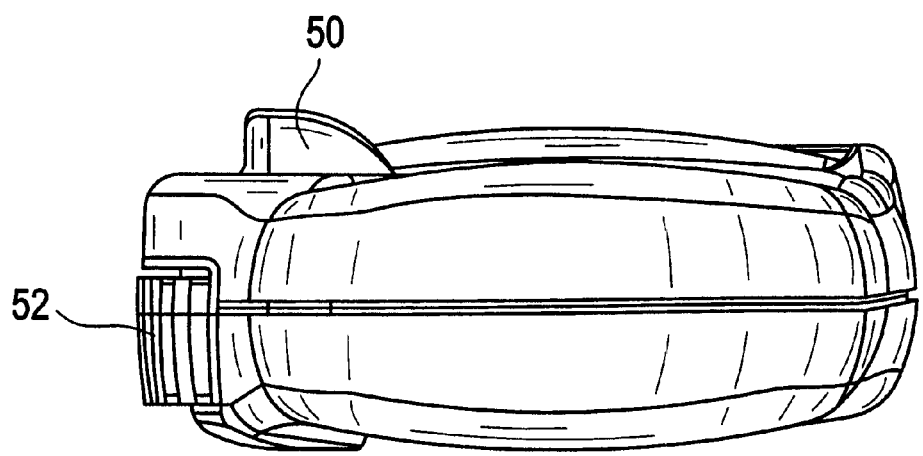
FIG. 7 is a top plan view thereof.
Figure 8:
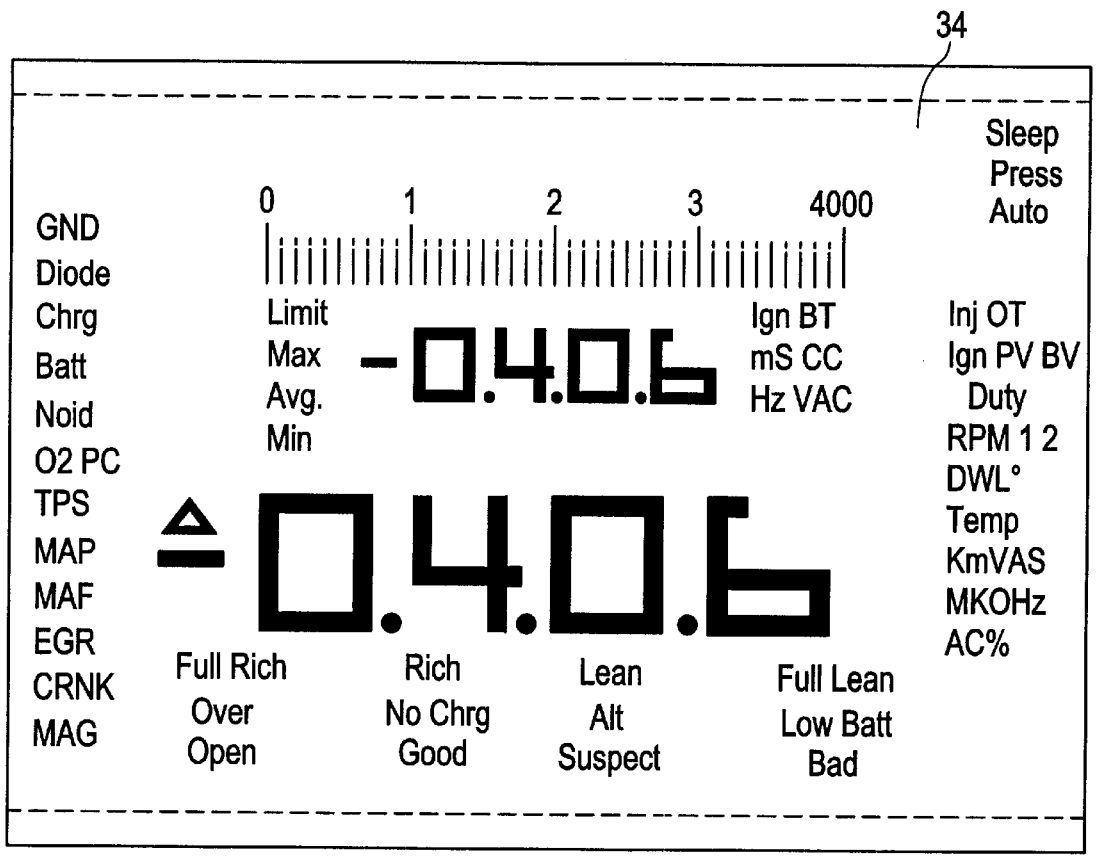
FIG. 8 is a view of the display screen showing numbers, letters and other indica fixed thereon.
Figure 9:
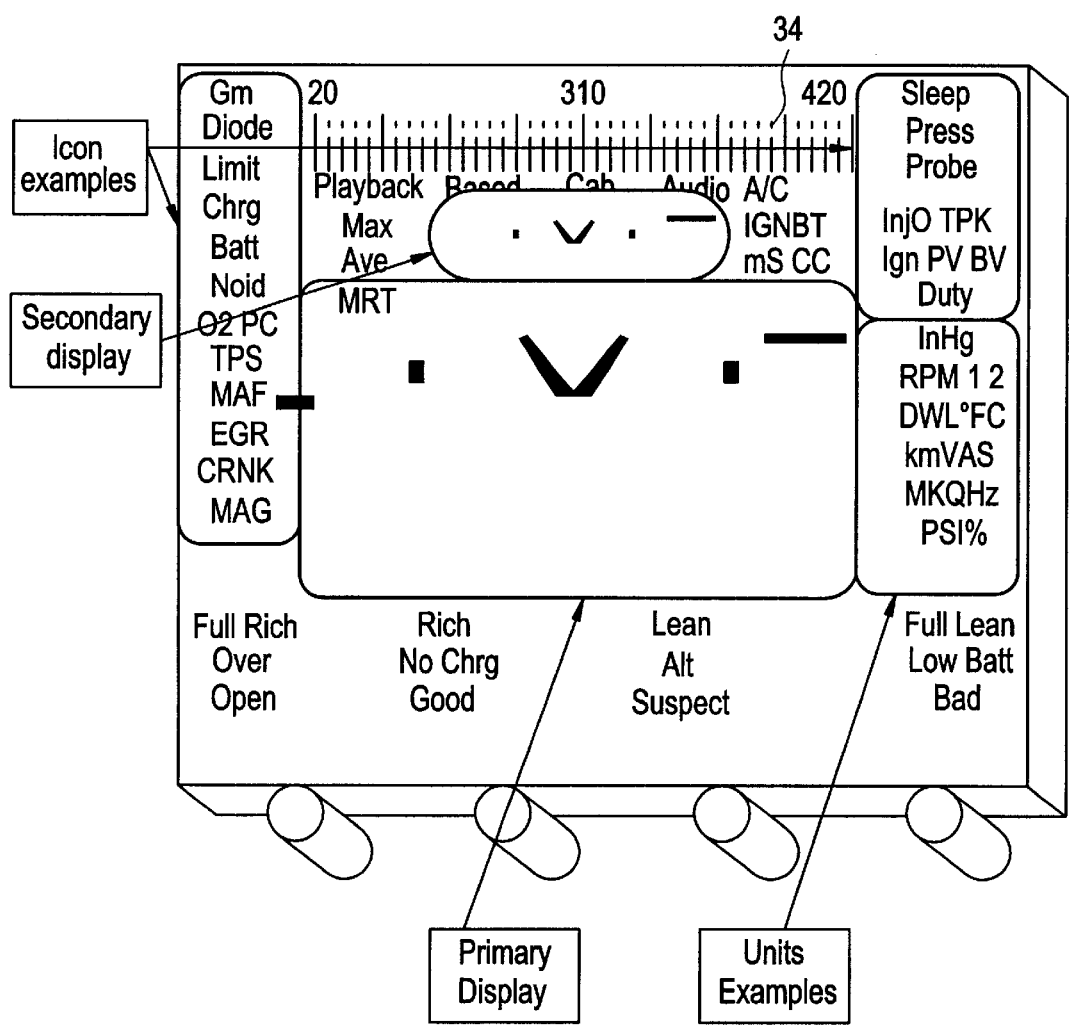
FIG. 9 is a close-up of the display screen.
Figure 10:
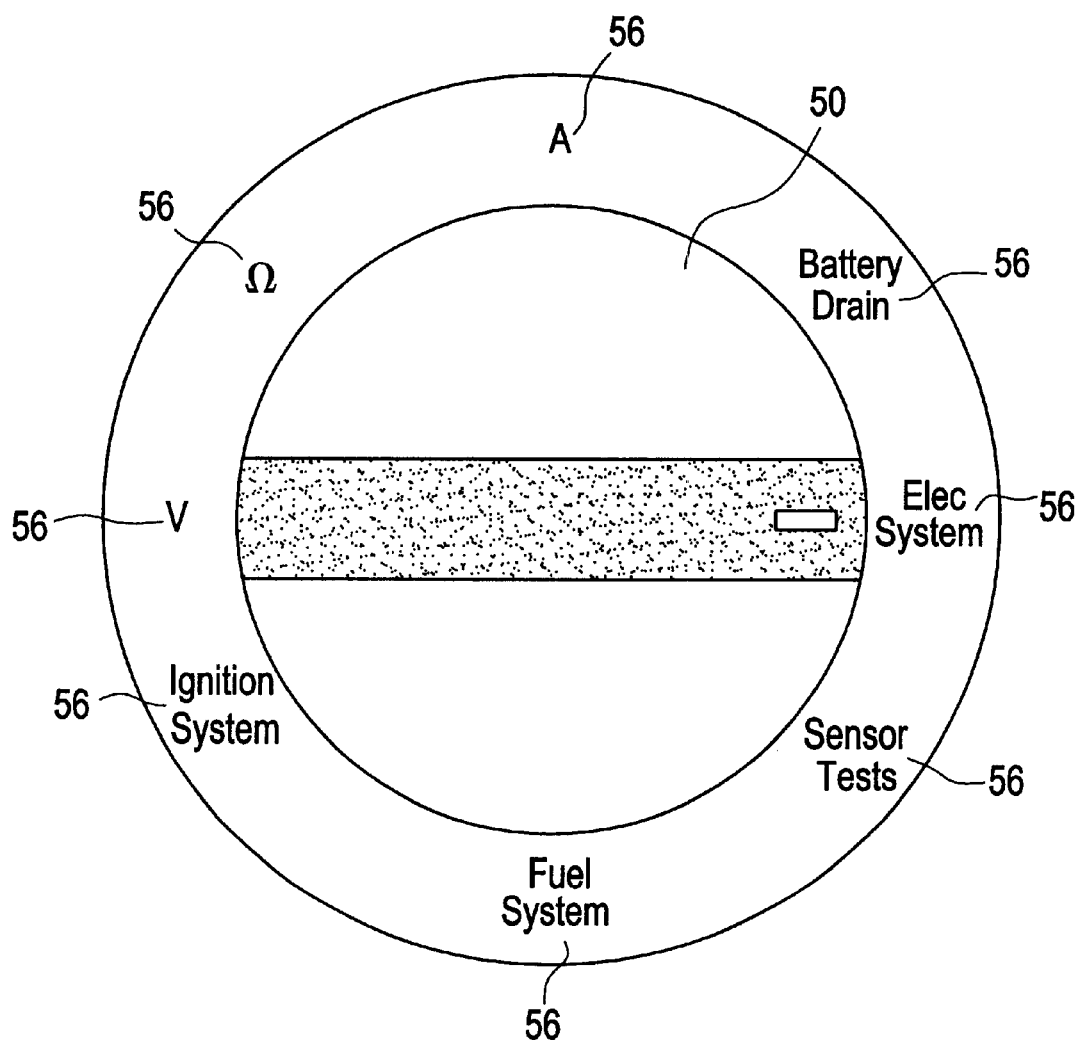
FIG. 10 is a close-up view of the dial and dial labels.

On the front surface 36, below the LEDs 38 are four buttons: mode 42, select 44, toggle up 46 and toggle down 48. A dial 50 is mounted between the four buttons and the LEDs 38. As can be seen in FIG. 2, on the side of the unit is a rotary switch 52. Rotary switches can be also referred to as thumb wheels. The term rotary switch or thumb wheel as described herein does not imply that an operator is limited to manipulation of rotary switch 52 with his or her thumb. It is known in the art that thumb wheels can be manipulated by any appropriate finger but are generally placed so that on operator can easily rotate the switch with his or her thumb. Four input/output jacks 54 are mounted on the front surface 36 near the lower end of the housing 58. The four input/out jacks are a common jack 54a, an amps/battery jack 54b, voltage, ohm, electric sensor, fuel ignition jack 54c and a signal/sync jack 54d, that are adapted to receive input from or give output to other electrical equipment.

The dial 50 and rotary switch 52 are used by the operator to change what is illuminated on display screen 34. Adjacent to the dial 50, are labels 56 for the display screen selections that either the dial labels 56 or rotary switch 52 are capable of selecting with manipulation from the operator. The labels are more clearly shown in FIG. 10. Three of the dial labels 56 indicate to the operator functions that are performed by multimeters, namely "A" for amps, "Ω" for ohms, and "V" is for volts. The other labels read "Battery Drain," "Elec. System," "Sensor Tests," "Fuel System," and "Ignition System." When the rotary switch 52 is turned, it simultaneously changes the position of the dial 50, while a turn of the dial 50 will likewise rotate the rotary switch 52. The operator may therefore conveniently turn the dial 50 or the rotary switch 52 to change the selection of available tests and function displayed on the display screen 34. The rotary switch 52 may be turned by any of the operator's fingers, including the thumb. A turning of either the dial 50 or the rotary switch 52 will change the illuminated numbers, letters and/or indica of a display screen 34, according to the selection the operator has made.

Below are described suitable methods and display screens for using the present invention. However, other displays, indica etc. can be substituted. Similarly the method steps can be done in any suitable order. Any nonessential steps may be omitted.

When information conveyed by the display screen has been chosen by the operator according to what system he or she desires to test, the operator has further selection choices within the chosen display screen by pressing the mode and select buttons. The operator makes a display screen selection 34 using the rotary switch 52. When the mode button 42 is pressed, a selectable test icon will be illuminated. The selectable test icon is either the units or the test name abbreviation, for example, if the "Electrical Selection" screen display is selected, the "Duty" mode is displayed by default. If the mode button 42 is pressed, again "Ground" is displayed. Pressing the mode button 42 again will display "Charging System." And pressing the mode button 42 one more time will display the original mode "Duty." In certain modes, the operator will be presented with additional choices. For example, in the oxygen sensor mode, the operator can select between an output of 0.8V for 5 seconds, or an output of 0.2 V for 5 seconds. This is done with the use of the toggle up button 46 and the toggle down button 48. When the desired resolution is indicated, the select button 44 is pushed, thereby selecting the desired resolution. Other modes that offer further selections include Vdc, Vac, RPM, Duty, Hz, Ohmns, Amps, ignition and burn voltage and burn time.

As previously mentioned, the LEDs 38 are mounted adjacent to the display screen 34 so that the display screen 34 serves to label the LEDs 38 according to the test being performed. A rotation of the dial 50 or the rotary switch 52 changes the label of that LED 38 displays. For example, when "Battery Drain" is selected by the rotary switch 52/dial 50 combination, the display screen 34 adjacent to and above each individual LED 38 respectively reads "Over," "No Chrg," "Alt," and "Low Batt" respectively. When "Elec System" is selected by the rotary switch 52/dial 50 combination, and the mode button 42 is pressed until "Chrg" is illuminated the display screen 34 above each LED 38 respectively reads "Over," "No Chrg," "Alt," and "Low Batt."

Volts

With the "V" position selected by the rotary switch 52, the units will default to auto-ranging D/C Volts. The icon "Auto" will be illuminated as will the units "V". The A/C readings under this switch selection will be True RMS. The common jack 54a and volt input jack 54c are used for this test.

The pressing of the mode button 42 will cause the arrow keys to become functional. After scrolling "V, RPM, and Duty" and selecting, the units will begin to flash. The positions that can be selected are Vdc, Vac, RPM, Duty, Hz, and Temp. When testing volts, the volts can be tested up to the ranges of 400 mV, 4V, 40V, and 400V. The resolutions for these tests are 100 uV, 1 mV, 10 mV and 100 mV respectively. There is also an autorange feature for the testing of volts. RPM can be displayed as 24 stroke or 12 stroke, with respective resolutions of 30 to 9000 RPMs and 60 to 12000 RPMs. RPM covers conventional, DIS, and coil-on-plug ignition systems. Duty can be resolved from 0.0 to 99.9% or 2 to 1999.9 meters per second. The different values of the duty are selected by use of the select button 44.

Ohms

With the rotary switch 52 in the "Ω" position ohms can be tested and the "Ω" units will appear. The common jack 54a and volts input jack 54c are used for this test. Pressing the mode button 42 will allow the user to select ranges of ohms to be tested. Available ranges are from 400 ohms, 4 k kilo ohms, 40 kilo ohms, 400 kilo ohms, 4 mega ohms and 40 mega ohms. The resolution for each range is 0.1, 1, 10, 100, 1,000 and 10,000 ohms respectively. In this display screen a diode light may also be tested in a range up to 4 volts.

Amps

With the switch in the "A" position, the "A" units will appear and amps can be tested. The common and amp input jacks are used for this test. Amps can be tested in an autorange test or in ranges up to 4 mA, 40 mA, 400 mA, 4 A and 10 A.

Battery Drain Test

The battery drain test is initiated by setting the rotary switch 52 to "Drain Test." The "Batt" icon is then illuminated, and the following labels appear above the LEDs 38: Over, No Chrg, Alt, Low Batt, which respectively stand for off, 0<x<20 mA, 20<x<80 mA, and >80 mA. The display screen will also display a readout in Amps or mAmps.

This test measures the amount of current in milliamps that the vehicle battery supplies with the ignition key and all accessories turned off. The test is utilized by disconnecting the vehicle battery negative harness, placing the leads in-circuit to measure the battery current drain. The user will then be notified of the amount of drain by the illumination of the LEDs 38 located below the display screen 34. If only the left most LED is illuminated, this is considered negligible drain, with the amount of drain increasing as LED's are illuminated from left to right. The LED descriptors used for the ground test will be utilized for this feature, which are (left to right): Open, Good, Suspect, Bad. The common and amp input jacks 54 are used for the battery drain test.

The following instructions are to be followed when the operator wishes to apply the battery drain test. First, the operator turns the ignition and accessories off. Then the operator disconnects the negative battery cable and attaches the amp lead to the cable and the common lead to the negative battery post. The operator then observes the LEDs 54. This can take up to about 30 minutes. If the first LED illuminates then a negligible drain is indicated, up to the second LED indicates low drain, up to the third LED indicates marginal drain, and if up to the fourth LED indicates high drain. If the third or fourth LED condition is observed, then the operator should check the fused and non-fused circuit for malfunction.

Electrical System

This display screen selection contains the following set of icons, which will be illuminated in the following order: Duty, Grn, Diode, Limit, and Chrg. The common jack 54a and volts jacks 54c are used for the testing modes for the electrical system.

The ground test feature is capable of locating bad grounds, voltage drops, intermittent connections, or any source of high resistance in automotive electrical circuits and grounds. With the leads connected to "Common" and "Volts", and the rotary switch 52 selection on "Elec System", pressing mode button 42 will start the current electrical system icon flashing. The toggle up button 46 or the toggle down button 48 are used to scroll to "Grn". Once "Grn" is flashing, the select button 44 is pressed to begin the test. The unit will then send an AC signal through the wire then measure the drop of that signal to determine the integrity of the circuit. One of the four LED's located below the display will illuminate when the measurement has been taken. The screen adjacent to the LEDs will be labeled on the screen (left to right) Open, Good, Suspect, Bad.

The duty cycle functions as a duty cycle test currently available in common digital multimeters. This feature is also available under the volts selection.

The limit setting feature is designed to be used in conjunction with the torque extensions, and can also be used for any reading that requires an alarm when a certain limit is reached. Pressing the toggle up button 46 or the toggle down button 48 will scroll to the desired reading (in 1 mV increments), which will readout on the secondary display. Pressing the select button 44 again will remove "Set" and the primary display will show the live value. The torque adapter is then placed into the "Common" and "Elec Sys" input jacks. Then upon use of the torque extension, when the selected reading is reached, the four LEDs 38 will illuminate and the unit will audibly beep in unison.

The charging system test is selected by the mode button 42 and the toggle up button 46 or the toggle down button 48 are used to scroll until "Chrg" is illuminated. This will change the display above the LEDs 38 to read (right to left): Over, No Chrg, Alt., Low Batt. There are a few different results that may be accomplished with this feature, which will result in one or more of the LEDs 38 illuminating.

Sensor Tests

This display screen selection contains the following set of icons, which will be illuminated in the following order: O2, TPS, MAP, MAF, EGR, CRNK, MAG (for magnetic). In all cases, the Common and the Volts input/output jacks 54 are used.

The O2 sensor test is designed to hook in parallel with the O2 sensor circuit and measure the voltage on the sensor. The mode buttons 42 and the toggle up button 46 or the toggle down button 48 are used to illuminate "02". After pressing the select button 44 to begin the test, the main display will show O2 sensor voltage, while the secondary display will display the output as either 0.8V for 5 seconds or 0.2 V for 5 seconds. The units for each display will be automatically defaulted to CC and D/C V. "CC" stands for cross counts which are the number of times the reading crosses 0.45V per second. During this test, the LEDs 38 are labeled on the screen (left to right), Full Lean, Lean, Rich, and Full Rich respectively. These are respectively represented by Vdc<= 0.3, 0.3<Vdc<0.45, 0.45<=Vdc<0.6, Vdc>=0.6.

Also while in this display the toggle up button 46 for rich or the toggle down button for lean may be pressed to send out a rich command or a lean command for 5 seconds, during which the "Rich" or "Lean" will flash on the display, dependent upon which was commanded. This signal is preferably strong enough to override the signal from the sensor so the circuit does not need to be interrupted. During this time the display will show the signal level that is at the O2 sensor to see that the condition is being compensated for. A third lead is connected between the "Signal" input jack and the O2 connector on the ECM side. The analog bar graph should range from 0–1V and should also track the O2 sensor signal using a 3 bar segment.

After the TPS sensor icon is selected, the units will default to D/C V. The bar graph plays a critical role in the display of this reading. As the sensor is cycled, the bar graph rises and falls with the sensor. The primary numeric display will also show the voltage. This test also contains a glitch type capture where a dropout in the sensor can be noticed on the bar graph by flashing that portion of the bar graph for a second or so as the bar is rising and falling. The unit also beeps and the LEDs 38 flash when a glitch is noticed.

The MAP/BP sensor selection can be changed from V to Hz. The primary display is utilized for the live value and the secondary display can be toggled between Min and Max.

The MAF sensor selection can be changed from V to Hz. The primary display is utilized for the live value and the secondary display can be toggled between Min and Max.

The EGR sensor selection can be changed from V to Hz. The primary display is utilized for the live value and the secondary display can be toggled between Min and Max.

The crank sensor selection can be changed from V to Hz. The primary display is utilized for the live value and the secondary display can be toggled between Min and Max.

The magnetic pickup units for this selection is A/C V. The primary display is utilized for the live value and the secondary display can be toggled between Min and Max.

Fuel Tests

The fuel tests display screen selection contains the following set of icons, which will be illuminated in the following order: InjOTPK, Noid, and Press. When performing fuel tests, the Common and the Volts input/output jacks 54 are used.

The noid light test feature utilizes the LEDs 38 on the front of the DAT to function like noid lights currently being sold in the OTC product line. The mode button 42 and the toggle up button 46 or the toggle down button 48 to illuminate "Noid". With the leads connected between the "Common" and "Fuel/Sensor" input/output jacks 54 and the injector harness, the LEDs 38 will blink as the signal is received from the vehicle. The noid light test may be performed with standard digital multimeter probes.

The fuel injector test function will display peak voltage and on-time for both throttle-body and port injection systems. On time handles peak/hold type injectors 42, as well as on time injectors, where peak/hold has a two step voltage level. Mode and select buttons 44 are used to choose the "InjOTPK" icon. The primary display will show injector peak voltage with "mV" as units. The secondary display will show injector on-time with "mS" units illuminated.

The pressure/vacuum test feature employs the integration of a digital pressure gauge to utilize the existing pressure transducers. A single channel pressure circuit is utilized, and is most effective if an adapter were developed to utilize the existing DAT input jacks. This feature is initiated by pressing the mode button 42 until "Press" is illuminated, and the units display "PSI".

Ignition Tests

This display screen selection contains the following set of icons, which will be illuminated in the following order: IgnBT & IgnPV, IgnBV, RPM, Dwell.

The ignition test is designed to measure Spark KV, Burn KV, and Burn Time. This feature uses a digital spark plug test as a probe. By using the mode 42 and select buttons 44, the operator chooses "IgnPV", and the primary display will be defaulted to peak voltage with "kV" units. The secondary display will show burn time with the "Burn mS" icon/unit illuminated. Pressing the mode button 42 will start the "IgnPV" flashing and the toggle up button 46 and the toggle down button 48 will toggle between "Ign PV" and "IgnBT", while the units remain "kV".

The RPM selection has the same functionality available under the "Volts" display screen selection. The dwell selection also has the same functionality available under the "Volts" display screen selection.

Two Channel w/Split Screen

This gives the capability to analyze and display two separate signals. Features such as Min/Max, Data Hold, Signal Out, etc. are available when the DAT is operating in this mode.

The record function gives the DAT the ability to record under certain functions allowing the user to playback the recorded information. This feature is initiated by depressing the mode button 42 to illuminate "Record", then pressing the select button 44 to start and stop the record process. To replay the recorded event, the mode button is pressed until "Playback" is illuminated, then the select button is pressed to start and stop the replay. This can also pass the information through the RS232 connector for playback on a PC. The capability to record a single event is determined to be the minimum requirement.

The infra-red temperature adapter is a feature that is in the form of an adapter that could be connected to the common 54*a* and volts 54*b* input jacks and displays the temperature ranging from 0 to 1000° F. or °C. The LEDs 30 do not have any required functionality for this feature.

The RS232 is available for communication with a PC. This feature is available for all settings by pressing the mode button 42 and highlighting "PC". This allows for live data display or playback of a recorded event on a PC.

The user definable probe selection feature allows for selection of different settings dependent upon the probe being used. This allows the user to set the gain and units of measurement by pressing the mode button 42 until "Probe" is illuminated, and the toggle up button 46 and the toggle down button 48 keys are used to set the first value, 1 for example. The select button 44 is then pressed again and the toggle up button 46 and the toggle down button 48 keys are used to scroll through and select the appropriate units. Select is pressed again and the bottom live data display begins to blink, scroll and enter the value, etc. Pressing the select button 44 again will save the setting and move to live data. The final setting, for example, reads 1 mA=10 A. This allows the actual values to be displayed when the unit is used in conjunction with various probes.

It is understood that the above described tests are merely examples and can be modified without departing from the spirit and scope of the present invention. Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A handheld electronic instrument for monitoring and diagnosing the operation of a vehicle comprising:

a display;

a microprocessor operated by a computer program providing at least two display selections for the display; and a rotary switch for rotation by an operator for selecting one of said at least two display selections, wherein said instrument has a front and a back and said rotary switch is attached to a side of said instrument and is capable of being alternatively rotated from the front of said instrument.

2. An instrument of claim 1, further comprising a plurality of buttons.

3. An instrument of claim 1, wherein at least one of said display screens selections has at least two operating modes and wherein one of a plurality of buttons is a mode button capable of selecting said operating mode.

4. An instrument of claim 3, wherein one of said display screen selections allows the operator to monitor and diagnose the performance of the electrical system of said vehicle.

5. An instrument of claim 4, wherein one of said operating modes allows the operator to perform a duty cycle test, a ground test, a diode test, a charging system test or torque extension test.

6. An instrument of claim 3, wherein one of said display screen selections allows the operator to perform sensor tests.

7. An instrument of claim 6, wherein one of said operating modes allows the operator to perform a oxygen sensor test, a TPS sensor test, a MAP/BP sensor test, an MAF sensor test, an EGR sensor test, a crank sensor test or a magnetic pump pickup sensor test.

8. An instrument of claim 3, wherein one of said display screen selections allows the operator to monitor and diagnose the performance of the fuel system.

9. An instrument of claim 8, wherein one of said operating modes is capable of performing a noid light test, a fuel injection test or a pressure/vacuum test.

10. An instrument of claim 3, wherein one of said display screen selections allows the operator to monitor and diagnose the performance of the ignition system.

11. An instrument of claim 10, wherein one of said display screen selections allows the operator to measure spark KV, burn KV, burn time, RPM, and dwell.

12. An instrument of claim 1, wherein one of said display screen selections is for measuring volts.

13. An instrument of claim 1, wherein one of said display screen selections is for measuring ohms.

14. An instrument of claim 1, wherein one of said display screen selections is for measuring amps.

15. An instrument of claim 1, wherein one of said display screen selections is for measuring battery drain.

16. An instrument of claim 1, further comprising a plurality of LEDs capable of conveying diagnostic information to said operator, wherein said LEDs convey said diagnostic information in accordance with said operating mode.

17. An instrument of claim 16, wherein one of said LEDs is capable of being illuminated when a predetermined threshold is reached.

18. An instrument of claim 17, wherein said LEDs are placed adjacent to said display screen and said display screen is capable of labeling the diagnostic information conveyed by said LED.

19. An instrument of claim 1, wherein said rotary switch is capable of being rotated by the thumb of said operator.

20. A method for controlling a handheld electronic instrument for monitoring and diagnosing the operation of a vehicle comprising selecting an appropriate display screen output by a rotary switch mounted to a side of said instrument, wherein said rotary switch is capable of being alternatively rotated from the front of said instrument.

21. A method of claim 20, further comprising:
   selecting the function of said instrument by a first button mounted on said instrument.

22. A method of claim 21, further comprising:
   selecting a scale for the displayed units of said instrument by a second button mounted on said instrument.

* * * * *